(12) United States Patent
Balzer et al.

(10) Patent No.: US 11,280,819 B2
(45) Date of Patent: Mar. 22, 2022

(54) CIRCUIT ARRANGEMENT AND METHOD FOR DETERMINING A RESISTANCE CHANGE AND METHODS FOR DETERMINING LEAD RESISTANCES

(71) Applicant: Beckhoff Automation GmbH, Verl (DE)

(72) Inventors: Daniel Balzer, Bielefeld (DE); Mikko Saukoski, Herford (DE)

(73) Assignee: Beckhoff Automation GmbH, Verl (DE)

( * ) Notice: Subject to any disclaimer, the term of this patent is extended or adjusted under 35 U.S.C. 154(b) by 0 days.

(21) Appl. No.: 17/097,609

(22) Filed: Nov. 13, 2020

(65) Prior Publication Data
US 2021/0156896 A1   May 27, 2021

(30) Foreign Application Priority Data
Nov. 25, 2019 (DE) ..................... 10 2019 131 849.1

(51) Int. Cl.
*G01R 27/14* (2006.01)
(52) U.S. Cl.
CPC ................... *G01R 27/14* (2013.01)
(58) Field of Classification Search
CPC ........ G01R 27/00; G01R 27/02; G01R 27/08; G01R 27/025; G01R 27/205; G01R 27/14; G01R 17/00; G01R 17/105; G01R 15/04; G01K 7/20
See application file for complete search history.

(56) References Cited

U.S. PATENT DOCUMENTS 5,371,469 A   12/1994   Anderson

FOREIGN PATENT DOCUMENTS

| DE | 1236049 B | 3/1967 |
| DE | 102004052795.4 B3 | 8/2006 |
| DE | 10120983.5 B4 | 8/2010 |

(Continued)

OTHER PUBLICATIONS

Kreuzer, Manfred et al. "Comparative consideration of different circuit types for measuring with strain gauges." (1983) 13 pages including English translation.

(Continued)

*Primary Examiner* — Son T Le
(74) *Attorney, Agent, or Firm* — Dorsey & Whitney LLP

(57) ABSTRACT

In a circuit arrangement for determining a resistance change, a measuring resistor can be connected by first and second supply leads and first and second sensor leads in a four-wire arrangement, such that the first supply lead and the measuring resistor form a first resistor of a first voltage divider, and the second supply lead and a supplementary resistor form a second resistor of the first voltage divider. The circuit arrangement has a second voltage divider with third and fourth resistors. The first and second voltage dividers form a Wheatstone bridge. The circuit arrangement is configured to apply a supply voltage across the Wheatstone bridge, to determine first and second supply voltage drops across the first and second supply leads, and to determine an ascertainment voltage in proportion to a reference voltage. The ascertainment voltage depends on a bridge voltage applied between the first and second voltage dividers.

21 Claims, 4 Drawing Sheets

(56) References Cited

FOREIGN PATENT DOCUMENTS

| | | | |
|---|---|---|---|
| DE | 102009058387 A1 | 6/2011 | |
| DE | 10120982.7 B4 | 5/2017 | |
| EP | 1253413 A1 * | 10/2002 | ............ G01L 25/00 |
| EP | 1253428 A2 | 10/2002 | |

OTHER PUBLICATIONS

"Introduction to strain gauge technology," ME-Messsysteme GmbH, (1999) 46 pages including English translation.
Examination Report dated Nov. 3, 2020 in connection with German patent application No. 102019131849, 22 pages including English translation.

* cited by examiner

CIRCUIT ARRANGEMENT AND METHOD FOR DETERMINING A RESISTANCE CHANGE AND METHODS FOR DETERMINING LEAD RESISTANCES

CROSS-REFERENCE TO RELATED APPLICATIONS

This application claims priority to German priority application DE 10 2019 131 849.1, filed Nov. 25, 2019, which is incorporated by reference herein, in the entirety and for all purposes.

FIELD

The present invention relates to a circuit arrangement and a method for determining a resistance change. The invention also relates to a method for determining lead resistances.

BACKGROUND

The four-wire arrangement is known in the prior art for the measurement of electrical resistances. This allows the value of an electrical resistance to be determined without distortion due to conductor and connection resistances.

The Wheatstone bridge is known from the prior art for measuring small changes in resistance.

Strain gauges are measuring devices known from the prior art that change their electrical resistance under deformation. They are used to measure expansive and compressive deformations. In the prior art, a change of the resistance of a strain gauge can be detected using, for example, a Wheatstone bridge.

Document EP 1 253 428 A2 describes a measuring bridge circuit in four- or multi-wire technology with suppression of lead losses. Document U.S. Pat. No. 5,371,469 describes an impedance measuring device that is immune to parasitic impedances. The book "Strain gauges" by Stefan Keil (DOI 10.1007/978-3-658-13612-3), in the chapter "Cables between DMS bridge circuit and measuring instrument", describes a measuring circuit with a regulated supply voltage.

SUMMARY

The present invention provides a circuit arrangement for determining a resistance change. The present invention also provides a method for determining a resistance change. The present invention also provides a method for determining lead resistances.

EXAMPLES

According to one aspect of the invention, in a circuit arrangement for determining a resistance change, a measuring resistor can be connected to the circuit arrangement by a first supply lead, a second supply lead, a first sensor lead and a second sensor lead in a four-wire arrangement, in such a way that the first supply lead and the measuring resistor form a first voltage divider resistor of a first voltage divider and the second supply lead and a supplementary resistor of the circuit arrangement form a second voltage divider resistor of the first voltage divider. The circuit arrangement also has a second voltage divider with a third voltage divider resistor and a fourth voltage divider resistor. The first voltage divider and the second voltage divider form a Wheatstone bridge. The circuit arrangement is designed to apply a supply voltage across the Wheatstone bridge, to determine a first lead voltage drop across the first supply lead, to determine a second supply voltage drop across the second supply lead and to determine an ascertainment voltage in proportion to a reference voltage. The ascertainment voltage depends on a bridge voltage applied between the first voltage divider and the second voltage divider.

According to another aspect of the invention, in a method for determining a change of resistance, a circuit arrangement of the above type is used. The method comprises steps for connecting a measuring resistor to the circuit arrangement in a four-wire arrangement, for determining the first lead voltage and the second lead voltage at a first value of the supply voltage different from 0 V, for determining the ascertainment voltage in proportion to the reference voltage at the first value of the supply voltage, and for calculating a change of resistance of the measuring resistor using the first lead voltage, the second lead voltage and the proportion of the ascertainment voltage to the reference voltage.

According to yet another aspect of the invention, a method for determining lead resistances comprises steps for connecting a reference resistor in a four-wire arrangement having a first supply lead, a second supply lead, a first sensor lead and a second sensor lead, for determining a first lead voltage drop across the first supply lead and a second lead voltage drop across the second supply lead at a first value of a total voltage, which is different from 0 V, applied across the first supply lead, the reference resistor and the second supply lead, and for calculating a first lead resistance of the first supply lead and a second lead resistance of the second supply lead using the formulas $$R_{S1} = R \frac{U_{S1}}{U_{ges} - U_{S1} - U_{S2}}$$

and $$R_{S2} = R \frac{U_{S2}}{U_{ges} - U_{S1} - U_{S2}}.$$

In these formulas, $R_{S1}$ denotes the first lead resistance, $R_{S2}$ the second lead resistance, R a resistance of the reference resistor, $U_{ges}$ the first value of the total voltage, $U_{S1}$ the first lead voltage and $U_{S2}$ the second lead voltage.

The circuit arrangement according to the invention can be implemented in different versions. Where the following descriptions apply to all versions of the circuit arrangement, no separate subdivision is made. If individual versions of the circuit arrangement only apply to particular embodiments of the circuit arrangement, for differentiation purposes the following text refers to a first circuit arrangement, a second circuit arrangement and a third circuit arrangement. This is used exclusively to provide a clear differentiation between the different versions of the circuit arrangement and is not to be understood restrictively in the sense that given a third circuit arrangement, for example, there must also be a first and/or second circuit arrangement. Of course, features described for the first, second and/or third circuit arrangement can also be used in one of the other circuit arrangements so that they are also included in the scope of the invention.

BRIEF DESCRIPTION OF THE DRAWINGS

The invention will be explained in further detail below with the aid of figures. In the drawings, schematically in each case.

DETAILED DESCRIPTION

Figure 1:
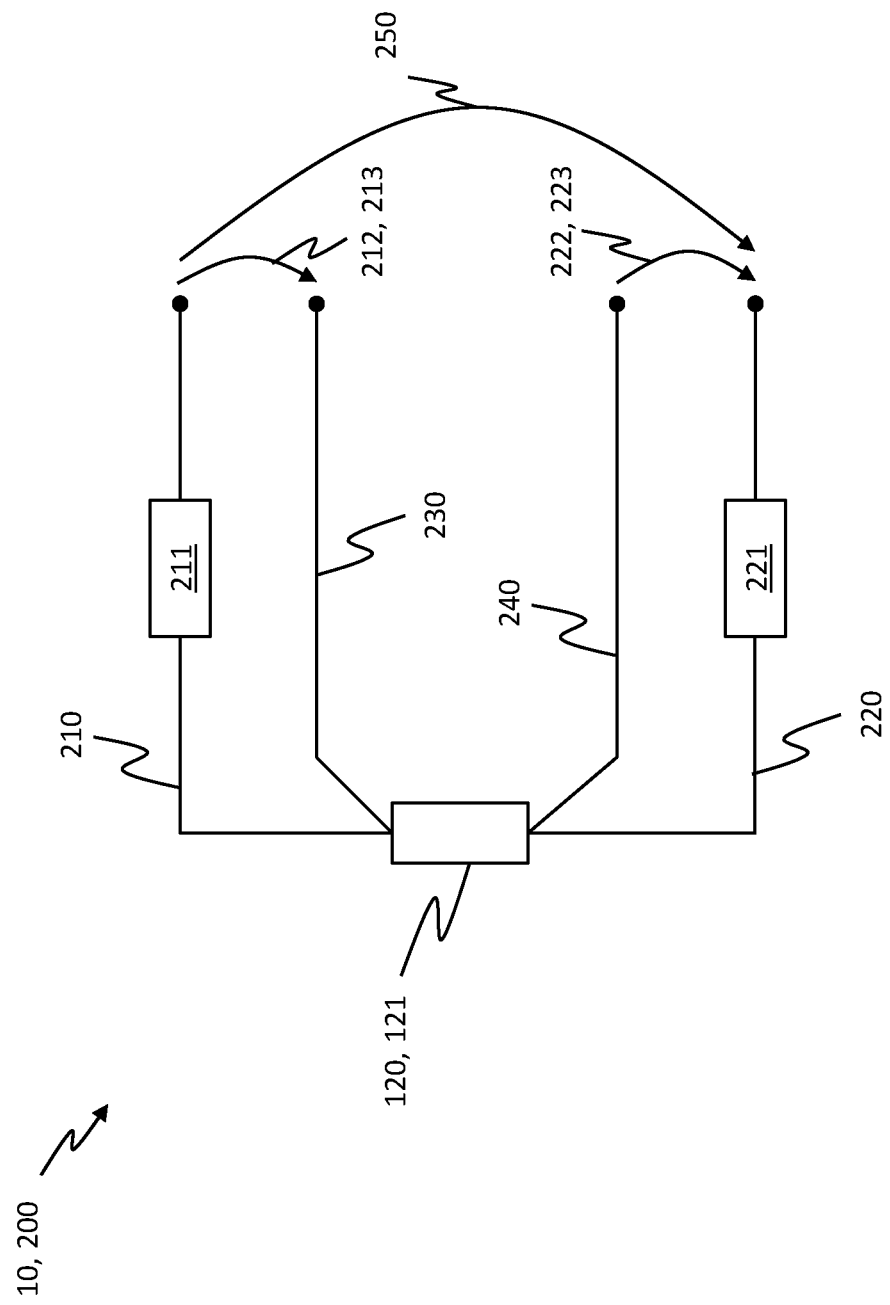
FIG. 1 shows a field circuit arrangement having a four-wire arrangement.

FIG. 1 shows a schematic illustration of a field circuit arrangement 10. The field connection arrangement 10 comprises a reference resistor 120 contacted in a four-wire arrangement 200.

The reference resistor 120 is a two-pole electrical component with a known resistance 121.

In the four-wire arrangement 200, a first contact of the reference resistor 120 is connected to a first supply lead 210 and to a first sensor lead 230. A second contact of the reference resistor 120 is connected to a second supply lead 220 and to a second sensor lead 240.

The first supply lead 210 in turn has a first lead resistance 211. The second supply lead 220 has a second lead resistance 221. The first lead resistance 211 and the second lead resistance 221 can have a non-negligible size compared to the resistance 121 of the reference resistor 120. A method is described below that allows the first lead resistance 211 and the second lead resistance 221 to be determined.

For the determination of the first lead resistance 211 and the second lead resistance 221, a fixed total voltage 250 is applied across the series circuit formed by the first supply lead 210, the reference resistor 120 and the second supply lead 220. The total voltage 250 has a value other than 0 V.

Then, a first lead voltage 212 drop across the first supply lead 210 and a second lead voltage 222 drop across the second supply lead 220 are determined. The first lead voltage 212 is determined between the first supply lead 210 and the first sensor lead 230. Since no electrical current passes through the first sensor lead 230, any electrical resistance of the first sensor lead 230 can be ignored. The second lead voltage 222 is determined between the second sensor lead 240 and the second supply lead 220. Since no electrical current passes through the second sensor lead 240 either, any electrical resistance of the second sensor lead 240 can also be ignored.

Even without the total voltage 250 applied across the first supply lead 210, the reference resistor 120 and the second supply lead 220, a first open-circuit voltage 213 can be dropped across the first supply lead 210 and the first sensor lead 230. Accordingly, even without the total voltage 250, a second open-circuit voltage 223 can be dropped across the second sensor lead 240 and the second supply lead 220. The first open-circuit voltage 213 and the second open-circuit voltage 223 can be induced, for example, by temperature gradients present within the first supply lead 210, the second supply lead 220, the first sensor lead 230 and the second sensor lead 240. In this case, the first open-circuit voltage 213 and the second open-circuit voltage 223 can also be called thermal voltages.

The first open-circuit voltage 213 and the second open-circuit voltage 223 can be determined by applying a total voltage 250 of 0 V across the series circuit of the first supply lead 210, reference resistor 120 and second supply lead 220. Then the first open-circuit voltage 213 is determined between the first supply lead 210 and the first sensor lead 230, and the second open-circuit voltage 223 is determined between the second sensor lead 240 and the second supply lead 220.

The determinations of the first lead voltage 212, the second lead voltage 222, the first open-circuit voltage 213 and the second open-circuit voltage 223 can of course also be carried out in reverse order, so that the first open-circuit voltage 213 and the second open-circuit voltage 223 are determined first, followed by the first lead voltage 212 and the second lead voltage 222.

As soon as the first lead voltage 212, the first open-circuit voltage 213, the second lead voltage 222 and the second open-circuit voltage 223 are known, the first lead resistance 211 and the second lead resistance 221 can be calculated. When the value of the total voltage 250 different from 0 V is applied, an electric current I flows in the reference resistor 120, which is given by:

$$I = \frac{U_{ges}}{R_{S1} + R + R_{S2}}.$$

Here, $U_{ges}$ denotes the value of the total voltage 250 different from 0 V. $R_{S1}$ denotes the first lead resistance 211. $R_{S2}$ denotes the second lead resistance 221. R denotes the resistance 121 of the reference resistor 120. The first lead resistance 211 and the second lead resistance 221 can be calculated with the formulas $$R_{S1} = \frac{U_{S1} - U_{L1}}{I} = R\frac{(U_{S1} - U_{L1})}{U_{ges} - (U_{S1} - U_{L1}) - (U_{S2} - U_{L2})} \quad (1)$$

and $$R_{S2} = \frac{U_{S2} - U_{L2}}{I} = R\frac{(U_{S2} - U_{L2})}{U_{ges} - (U_{S1} - U_{L1}) - (U_{S2} - U_{L2})} \quad (2)$$

where $U_{S1}$ is the first lead voltage 212. $U_{L1}$ denotes the first open-circuit voltage 213. $U_{S2}$ denotes the second lead voltage 222. $U_{L2}$ denotes the second open-circuit voltage 223.

It is possible to omit the determination of the first open-circuit voltage 213 and the second open-circuit voltage 223. When calculating the first lead resistance 211 and the second lead resistance 221, the first open-circuit voltage 213 and the second open-circuit voltage 223 are then set to 0. The formulas for calculating the first lead resistance 211 and the second lead resistance 221 then simplify to $$R_{S1} = R\frac{U_{S1}}{U_{ges} - U_{S1} - U_{S2}} \quad (3)$$

and $$R_{S2} = R\frac{U_{S2}}{U_{ges} - U_{S1} - U_{S2}}. \quad (4)$$

Figure 2:
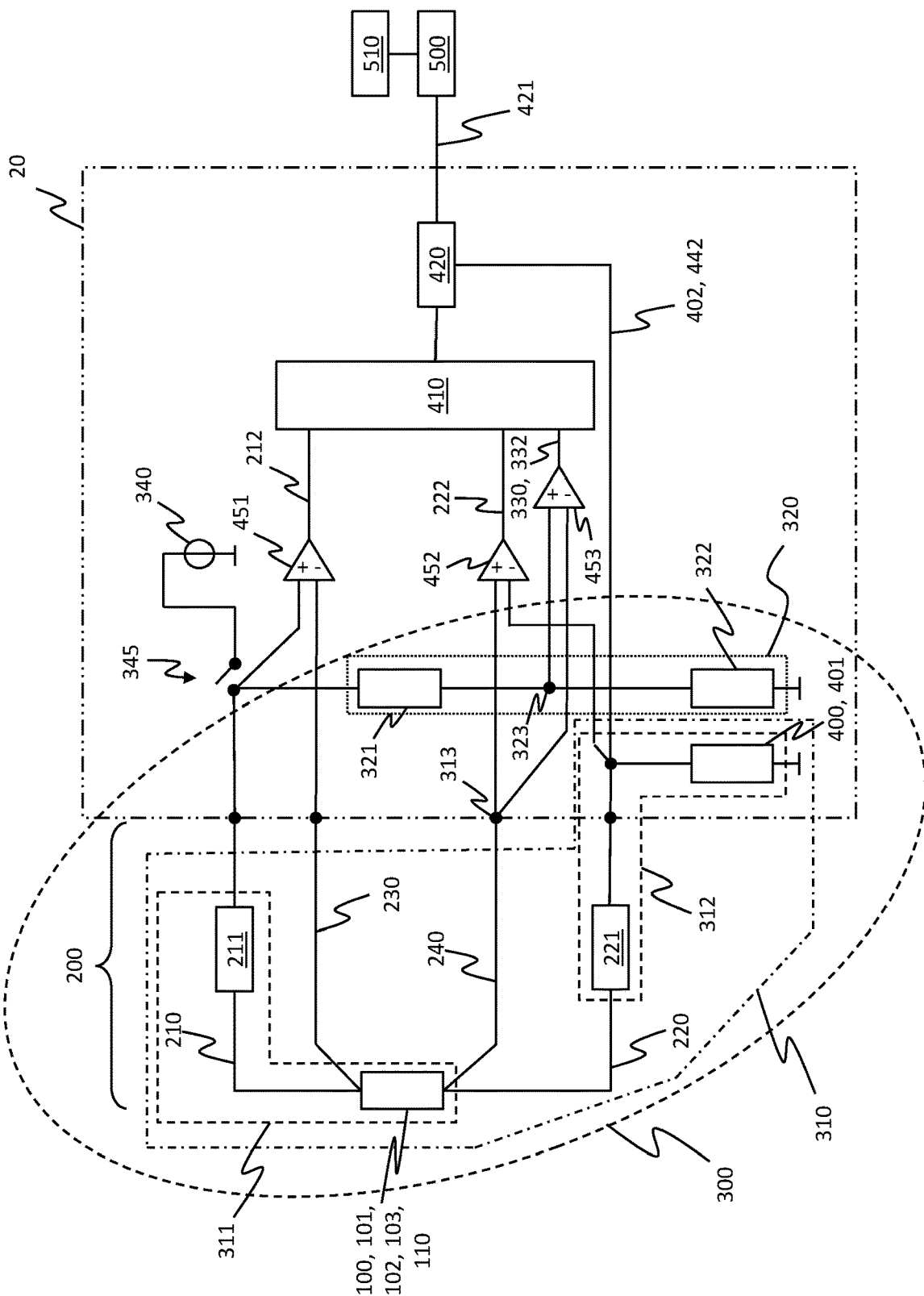
FIG. 2 shows a first circuit arrangement allowing the determination of a resistance change.

FIG. 2 shows a first circuit arrangement 20. The first circuit arrangement 20 is designed to determine a resistance change 103 of a measuring resistor 100. The resistance change 103 indicates how far an actual resistance 101 of the measuring resistor 100 deviates from a nominal resistance 102 of the measuring resistor 100. The first circuit arrangement 20 allows the resistance change 103 to be determined with high accuracy. The change of resistance 103 can be small compared to the nominal resistance 102 of the measuring resistor 100.

The measuring resistor 100 can be a strain gauge 110, for example. The strain gauge 110 can be used, for example, to detect expansive or compressive deformations. In this case, the resistance change 103 is a measure of the deformation detected by the strain gauge 110. The measuring resistor 100 can also be used, for example, to determine a temperature change or for another purpose.

The measuring resistor 100 can be connected to the first circuit arrangement 20 by the four-wire arrangement 200 shown in FIG. 1. The measuring resistor 100 then replaces the reference resistor 120 shown in FIG. 1. The measuring resistor 100 is thus connected to the first circuit arrangement 20 by the first supply lead 210, the second supply lead 220, the first sensor lead 230 and the second sensor lead 240, in such a way that the first supply lead 210 and the first sensor lead 230 are connected to a first contact of the measuring resistor 100, and the second supply lead 220 and the second sensor lead 240 are connected to a second contact of the measuring resistor 100.

The measuring resistor 100 can be arranged remotely from the first circuit arrangement 20. This means that the first supply lead 210 and the second supply lead 220 may have a long length. The first lead resistance 211 of the first supply lead 210 and the second lead resistance 221 of the second supply lead 220 are then not negligibly small.

The series circuit consisting of the first supply lead 210 and measuring resistor 100 forms a first voltage divider resistor 311. The second supply lead 220 and a supplementary resistor 400 connected in series with the second supply lead 220 of the first circuit arrangement 20 together form a second voltage divider resistor 312. The first voltage divider resistor 311 and the second voltage divider resistor 312 are connected in series in such a way that together they form a first voltage divider 310. The connection between the first voltage divider resistor 311 and the second voltage divider resistor 312 forms a first center node 313 of the first circuit arrangement 20.

In addition, the first circuit arrangement 20 has a second voltage divider 320, which is formed by a series circuit consisting of a third voltage divider resistor 321 and a fourth voltage divider resistor 322. For example, the resistances of the third voltage divider resistor 321 and the fourth voltage divider resistor 322 can range from 1 kΩ to 10 kΩ. The connection between the third voltage divider resistor 321 and the fourth voltage divider resistor 322 forms a second center node 323 of the first circuit arrangement 20.

The first voltage divider 310 and the second voltage divider 320 together form a Wheatstone bridge 300. For this purpose, the opposite end of the first supply lead 210 to the measuring resistor 100 is connected to the contact of the third voltage divider resistor 321 at the opposite end to the fourth voltage divider resistor 322. The contact of the supplementary resistor 400 at the opposite end to the second supply lead 220 is connected to the contact of the fourth voltage divider resistor 322 at the opposite end to the third voltage divider resistor 321. In the example of the first circuit arrangement 20 shown in FIG. 2, this circuit node is also connected to a reference potential (ground).

It is convenient if the Wheatstone bridge 300 is in a balanced state if the resistance 101 of the measuring resistor 100 corresponds to the nominal resistance 102 and the resistance change 103 has a value of 0. This can be achieved, for example, by the third voltage divider resistor 321 and the fourth voltage divider resistor 322 having identical resistances and at the same time a resistance 401 of the supplementary resistor 400 having an equal value to the nominal resistance 102 of the measuring resistor 100. The resulting conditions are particularly simple to calculate. However, it is also sufficient if the proportion of the resistances of the third voltage divider resistor 321 to the fourth voltage divider resistor 322 corresponds to the proportion of the resistance 401 of the supplementary resistor 400 to the nominal resistance 102 of the measuring resistor 100. Operation in a non-balanced state of the Wheatstone bridge 300 is also possible.

The first circuit arrangement 20 is designed to apply a supply voltage 340 across the Wheatstone bridge 300 formed from the first voltage divider 310 and the second voltage divider 320. In FIG. 2, a switch 345 is shown schematically, via which the supply voltage 340 can be applied. The switch 345 can optionally be omitted or can be designed or arranged differently. The supply voltage 340 is applied across the parallel circuit consisting of the first voltage divider 310 and the second voltage divider 320.

The first circuit arrangement 20 is designed to determine the first lead voltage 212 drop across the first supply lead 210. In the example of the first circuit arrangement 20 shown in FIG. 2, this has a first amplifier 451, which is connected to the first supply lead 210 and to the first sensor lead 230. However, the determination of the first lead voltage 212 drop across the first supply lead 210 can also be carried out differently.

The first circuit arrangement 20 is designed to also determine the second lead voltage 222 drop across the second supply lead 220. In the example of the first circuit arrangement 20 shown in FIG. 2, this has a second amplifier 452 for this purpose, which is connected to the second sensor lead 240 and to the second supply lead 220. However, the determination of the second lead voltage 222 drop across the second supply lead 220 can also be carried out differently.

The first circuit arrangement 20 is also designed to determine a bridge voltage 330 of the Wheatstone bridge 300 between the first voltage divider 310 and the second voltage divider 320. In the example of the first circuit arrangement 20 shown in FIG. 2, this has a third amplifier 453 for this purpose, which is connected to the second center node 323 and the first center node 313. However, the determination of the bridge voltage 330 can also be carried out differently. The bridge voltage 330 in the first circuit arrangement 20 is used as an ascertainment voltage 332.

The first circuit arrangement 20 has a multiplexer 410 and an analog-to-digital converter 420. The 410 multiplexer can be used to connect either an output of the first amplifier 451, an output of the second amplifier 452 or an output of the third amplifier 453 to an input of the analog-to-digital converter 420. A supplementary resistor voltage 402 drop across the supplementary resistor 400 is also supplied to the analog-to-digital converter 420 as the reference voltage 442. The analog-to-digital converter 420 is designed to convert the voltage value supplied via the multiplexer 410 into a dimensionless digital value 421 referenced to the supplementary resistor voltage 402. This enables the first circuit arrangement 20, the first lead voltage 212, the second lead voltage 222 and the bridge voltage 330 to be determined in each case in proportion to the supplementary resistor voltage 402 drop across the supplementary resistor 400.

It is possible to dispense with the multiplexer 410 and instead to provide a total of three analog-to-digital converters, of which one is connected to the output of the first amplifier 451, one to the output of the second amplifier 452 and one to the output of the third amplifier 453. This enables the first lead voltage 212, the second lead voltage 222 and the bridge voltage 330 to be determined simultaneously, in each case in proportion to the supplementary resistor voltage 402 drop across the supplementary resistor 400.

The first circuit arrangement 20 allows the first lead voltage 212, the second lead voltage 222 and the bridge voltage 330 to be determined sequentially, by connecting the output of the first amplifier 451, the output of the second amplifier 452 and the output of the third amplifier 453 to the input of the analog-to-digital converter 420 in succession using the multiplexer 410. The digital value 421 output by the analog-to-digital converter 420 corresponds in each case to the proportion of the first lead voltage 212, the second lead voltage 222 or the bridge voltage 330 to the supplementary resistor voltage 402.

In the first circuit arrangement 20, the total voltage $U_{ges}$ drop across the series circuit of the first supply lead 210, measuring resistor 100 and second supply lead 220 is given by:

$$U_{ges} = U_{S1} + U_{S2} + RI = U_{S1} + U_{S2} + R\left(\frac{U_{Erg}}{R_0}\right).$$

Here, R denotes the resistance 101 of the measuring resistor 100. $R_0$ denotes the nominal resistance 102 of the measuring resistor 100 and hence also the resistance 401 of the supplementary resistor 400, which is assumed to be of the same size. $U_{S1}$ again denotes the first lead voltage 212. $U_{S2}$ again denotes the second lead voltage 222. $U_{Erg}$ Denotes the supplementary resistor voltage 402. The same current I flows through the measuring resistor 100 as through the supplementary resistor 400.

This allows the formulas (3) and (4) given above to be expressed in the simplified form $$R_{S1} = R_0\left(\frac{U_{S1}}{U_{Erg}}\right) \quad (3')$$

and $$R_{S2} = R_0\left(\frac{U_{S2}}{U_{Erg}}\right). \quad (4')$$

$R_{S1}$ again denotes the first lead resistance 211. $R_{S2}$ again denotes the second lead resistance 221.

To determine the change of resistance 103 of the measuring resistor 100, the measuring resistor 100 is first connected to the first circuit arrangement 20 by the four-wire arrangement 200.

The supply voltage 340 is then applied across the Wheatstone bridge 300 with a voltage value which is different from 0 V.

Then the bridge voltage 330, the first lead voltage 212 and the second lead voltage 222 are determined. These voltages can be determined sequentially, one after another. It is sufficient if the voltages mentioned are each determined in proportion to the supplementary resistor voltage 402.

The first lead resistance 211 of the first supply lead 210 and the second lead resistance 221 of the second supply lead 220 can then be calculated using the formulas (3') and (4') given above, respectively.

In addition, the change of resistance 103 can be calculated using the formula $$\Delta R = 2R_0\left(\frac{U_{Br}}{U_{Erg}} - \frac{R_{S1} - R_{S2}}{2R_0}\right) \quad (5)$$

where ΔR denotes the change of resistance 103 of the measuring resistor 100 compared to the nominal resistance 102. $U_{Br}$ denotes the bridge voltage 330.

Formula (5) is obtained by consideration of the first voltage divider 310 and the second voltage divider 320 of the first circuit arrangement 20. The following applies:

$$\frac{U_{Br}}{U_{Erg}} = \left(\frac{R_a}{2R_a} - \frac{R_0 + R_{S2}}{R_0 + R_{S2} + R + R_{S1}}\right) \bigg/ \frac{R_0}{R_0 + R + R_{S2} + R_{S1}} = \frac{\Delta R}{2R_0} + \frac{R_{S1} - R_{S2}}{2R_0}.$$

Here, $R_a$ denotes the resistance of the third voltage divider resistor 321 and the fourth voltage divider resistor 322. This makes use again of the fact that the resistance 401 of the supplementary resistor 400 has an equal value to the nominal resistance 102 of the measuring resistor 100. It has also been assumed that the third voltage divider resistor 321 and the fourth voltage divider resistor 322 have the same resistance $R_a$.

Formulas (5), (3') and (4') indicate that for calculating the resistance change 103, the first lead resistance 211 and the second lead resistance 221 it is sufficient to determine the bridge voltage 330, the first lead voltage 212 and the second lead voltage 222 in each case in proportion to the supplementary resistor voltage 402.

The calculation of the resistance change 103, the first lead resistance 211 and the second lead resistance 221 can be carried out, for example, by an evaluation device 500, which receives the digital value 421 generated by the analog-to-digital converter 420. The evaluation device 500 can also be configured to control the multiplexer 410 in such a way that the bridge voltage 330, the first lead voltage 212 and the second lead voltage 222 are determined one after the other in the desired sequence.

The evaluation device 500 can also be designed to store at least some of the calculated values of the first lead resistance 211 and the second lead resistance 221 in a data memory 510. The values of the first lead resistance 211 and the second lead resistance 221 stored in the data memory 510 can be used to detect a defect in the first circuit arrangement 20, the first supply lead 210, the second supply lead 220, or other components. Indications of such a defect can be, for example, a gradual or sudden change of the first lead resistance 211 of the first supply lead 210 and/or in the second lead resistance 221 of the second supply lead 220.

In the operation of the first circuit arrangement 20, it is possible to determine the bridge voltage 330 more frequently than the first lead voltage 212 and the second lead voltage 222. This make sense if the resistance 101 of the measuring resistor 100 changes faster than the first lead resistance 211 of the first supply lead 210 and the second lead resistance 221 of the second supply lead 220. A recalculation of the first lead resistance 211 and the second lead resistance 221 using the formulas (3') and (4') is carried out each time new values of the first lead voltage 212 and the second lead voltage 222 have been determined. The resistance change 103 is recalculated using the formula (5) every time a new value of the bridge voltage 330 has been determined. The most recently calculated values of the first lead resistance 211 and the second lead resistance 221 are used.

Figure 3:
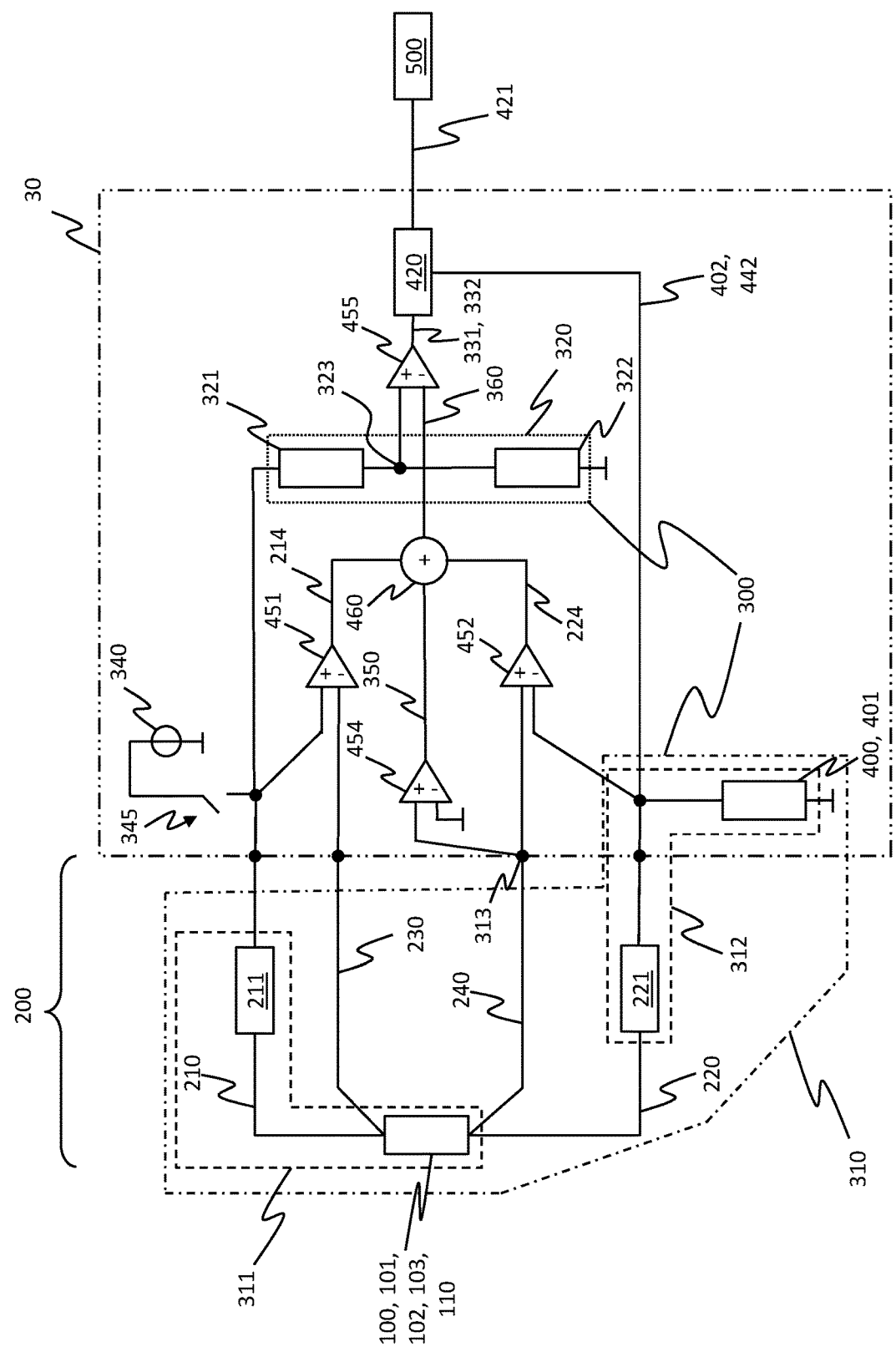
FIG. 3 shows a second circuit arrangement allowing the determination of a resistance change.

FIG. 3 shows a second circuit arrangement 30. The second circuit arrangement 30 has great similarities with the first circuit arrangement 20 of FIG. 2 and is also designed to determine the change of resistance 103 of the measuring resistor 100. The following text only describes how the second circuit arrangement 30 shown in FIG. 3 differs from the first circuit arrangement 20 shown in FIG. 2. In addition, the above description of the first circuit arrangement 20 also applies to the second circuit arrangement 30.

The second circuit arrangement 30 is designed to determine a modified bridge voltage 331 instead of the bridge voltage 330, which in the second circuit arrangement 30 is used as an ascertainment voltage 332. The following applies to the modified bridge voltage 331:

$$U_{Br2} + U_{Br} + \tfrac{1}{2}(U_{S2} - U_{S1}).$$

Here, $U_{Br}$ denotes the bridge voltage 330 and $U_{Br2}$ the modified bridge voltage 331. $U_{S1}$ again denotes the first lead voltage 212. $U_{S2}$ again denotes the second lead voltage 222.

Using the formulas (3') and (4') given above, formula (5) can thus be expressed in the following simplified form:

$$\Delta R = 2R_0 \left( \frac{U_{Br2}}{U_{Erg}} \right). \tag{5'}$$

where $\Delta R$ denotes again the change of resistance 103 of the measuring resistor 100 compared to the nominal resistance 102. $U_{Erg}$ again denotes the supplementary resistor voltage 402.

To determine the modified bridge voltage 331, the second circuit arrangement 30 has a fourth amplifier 454 instead of the third amplifier 453. The fourth amplifier 454 is connected to the first center node 313 and to the reference potential (ground) and is thus designed to determine a partial voltage 350 drop across the second voltage divider resistor 312 of the first voltage divider 310.

In the second circuit arrangement 30, the first amplifier 451 is configured such that the first lead voltage 212 detected by the first amplifier 451 is multiplied by a gain factor of 0.5 (zero point five) by the first amplifier 451. This means that the first amplifier 451 outputs half of the first lead voltage 214, which corresponds to half of the first lead voltage 212. It is also possible to use a gain factor other than 0.5 (zero point five).

In the second circuit arrangement 30, the second amplifier 452 is configured such that the second lead voltage 222 detected by the second amplifier 452 is multiplied by a gain factor of −0.5 (minus zero point five) by the second amplifier 452. This means that the second amplifier 452 outputs minus half of the second lead voltage 224, which corresponds to the negative value of half of the second lead voltage 222. It is also possible to operate the second amplifier 452 with a gain factor other than −0.5 (minus zero point five).

The second circuit arrangement 30 has an adder 460, which adds the halved first lead voltage 214 output by the first amplifier 451, the negated, halved second lead voltage 224 output by the second amplifier 452, and the partial voltage 350 determined by the fourth amplifier 454, thus forming a summed voltage 360. The adder 460 can be implemented as an analog component.

The second circuit arrangement 30 also has a fifth amplifier 455, which is connected to the second center node 323 and to the summed voltage 360 output by the adder 460. The fifth amplifier 450 has a gain factor of 1 (one) and thus determines the modified bridge voltage 331 according to the definition given above. Of course, another gain factor, for example a higher one, can also be chosen. This may need to be taken into account by a corresponding factor in formula (5').

From formula (5') it can be seen that in the second circuit arrangement 30, in order to determine the resistance change 103 only the modified bridge voltage 331 in proportion to the supplementary resistor voltage 402 needs to be determined. This means that the multiplexer 410 can be omitted in the second circuit arrangement 30. Instead, the output of the fifth amplifier 455 is directly connected to the analog-to-digital converter 420.

The supplementary resistor voltage 402 drop across the supplementary resistor 400 is again supplied to the analog-to-digital converter 420 as the reference voltage 442. The digital value 421 output by the analog-to-digital converter 420 thus indicates the proportion of the modified bridge voltage 331 to the supplementary resistor voltage 402.

The calculation of the change of resistance 103 using the formula (5') can again be carried out, for example, by the evaluation unit 500.

Since in the second circuit arrangement 30 only the modified bridge voltage 331, or its proportion to the supplementary resistor voltage 402, has to be output externally and the second circuit arrangement 30 does not have a multiplexer, the second circuit arrangement 30 allows a continuous determination of the resistance change 103 of the measuring resistor 100.

Figure 4:
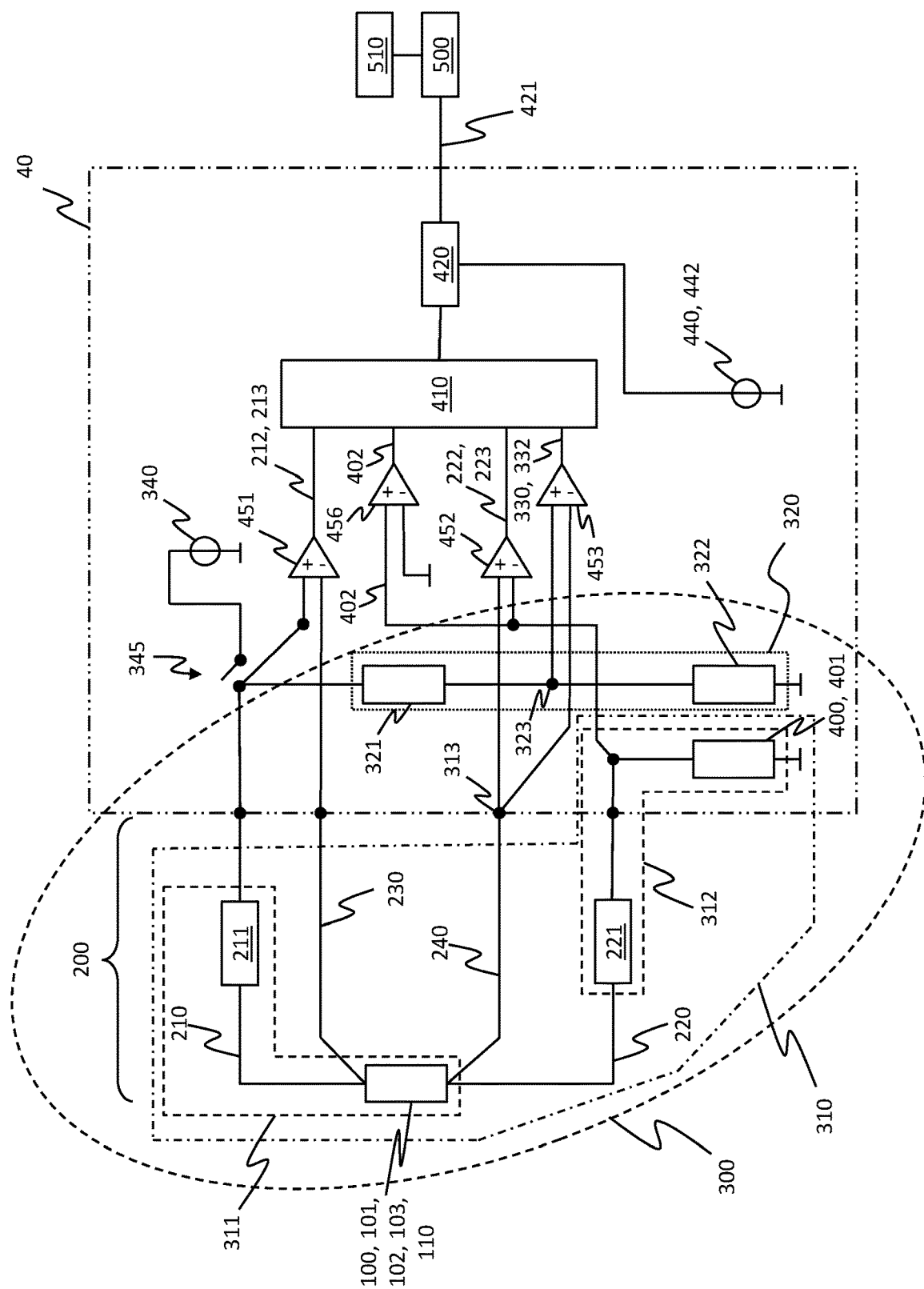
FIG. 4 shows a third circuit arrangement allowing the determination of a resistance change.

FIG. 4 shows a third circuit configuration 40. The third circuit arrangement 40 has great similarities with the first circuit arrangement 20 of FIG. 2 and is also designed to determine the change of resistance 103 of the measuring resistor 100 compared to the nominal resistance 102 of the measuring resistor 100. The following text merely describes how the third circuit arrangement 40 shown in FIG. 4 differs from the first circuit arrangement 20 shown in FIG. 2. In addition, the above description of the first circuit arrangement 20 also applies to the third circuit arrangement 40. In particular, in the third circuit arrangement 40, the bridge voltage 330 again forms the ascertainment voltage 332.

In the third circuit arrangement 40, an external voltage 440 can be applied which is supplied to the analog-to-digital converter 420 as the reference voltage 442 instead of the supplementary resistor voltage 402 drop across the supplementary resistor 400. This means that in the third circuit arrangement 40, the first lead voltage 212, the second lead voltage 222 and the bridge voltage 330 can be determined in proportion to the external voltage 440, whereas in the first circuit arrangement 20 they are determined in proportion to the supplementary resistor voltage 402.

The third circuit arrangement 40 also enables the supplementary resistor voltage 402 drop across the supplementary resistor 400, to be determined in proportion to the external voltage 440. For this purpose, the third circuit arrangement 40 has a sixth amplifier 456, the inputs of which are connected to the two sides of the supplementary resistor 400. The output of the sixth amplifier 456 is connected to the multiplexer 410, so that the supplementary resistor voltage 402 determined by the sixth amplifier 456 can be fed to the analog-to-digital converter 420 via the multiplexer 410. The digital value 421 output by the analog-to-digital converter 420 then indicates the proportion of the supplementary resistor voltage 402 to the external voltage 440.

In the third circuit arrangement 40 also, it is possible to dispense with the multiplexer 410 and instead to provide separate analog-to-digital converters for detecting the first lead voltage 212, the second lead voltage 222, the bridge voltage 330 and the supplementary resistor voltage 402.

In addition to determining the first lead resistance 211 of the first supply lead 210 and the second lead resistance 221 of the second supply lead 220, the third circuit arrangement 40 also allows the first open-circuit voltage 213 drop across the first supply lead 210 and the first sensor lead 230, and the second open-circuit voltage 223 drop across the second sensor lead 240 and the second supply lead 220, to be determined. The first open-circuit voltage 213 and the second open-circuit voltage 223 were described above by reference to FIG. 1.

For example, to determine the first open-circuit voltage 213 and the second open-circuit voltage 223, a supply voltage 340 with a value of 0 V can be applied across the Wheatstone bridge 300, or the Wheatstone bridge 300 can be disconnected from the supply voltage 340 by the switch 345, or the Wheatstone bridge 300 can be connected to reference potential (ground) instead of the supply voltage 340. The first amplifier 451 is then used to determine the first open-circuit voltage 213 drop across the first supply lead 210 and the first sensor lead 230, and this is fed via the multiplexer 410 to the analog-to-digital converter 420. The digital value 421 output by the analog-to-digital converter 420 then indicates the proportion of the first open-circuit voltage 213 to the external voltage 440. In addition, the second amplifier 452 is used to determine the second open-circuit voltage 223 drop across the second supply lead 240 and the second sensor lead 220, which is fed via the multiplexer 410 to the analog-to-digital converter 420. The digital value 421 output by the analog-to-digital converter 420 then indicates the proportion of the second open-circuit voltage 223 to the external voltage 440.

Since the external voltage 440 applied to the third circuit arrangement 40 is independent of the supply voltage 340 applied across the Wheatstone bridge 300 of the third circuit arrangement 40, the proportion of the first open-circuit voltage 213 to the external voltage 440 and the proportion of the second open-circuit voltage 223 to the external voltage 440 in the third circuit arrangement 40 can be determined with a value of the supply voltage 340 of 0 V. However, it would not be possible to determine the proportion of the first open-circuit voltage 213 and the second open-circuit voltage 223 to the supplementary resistor voltage 402 drop across the supplementary resistor 400 with a value of the supply voltage 340 of 0 V, since with a value of 0 V for the supply voltage 340, the supplementary resistor voltage 402 drop across the supplementary resistor 400 also has a value of 0 V.

After determining the first open-circuit voltage 213 and the second open-circuit voltage 223 at a value of 0 V for the supply voltage 340, a supply voltage 340 different from 0 V is applied across the Wheatstone bridge 300 of the third circuit arrangement 40. Then the first lead voltage 212, the second lead voltage 222, the bridge voltage 330 and the supplementary resistor voltage 402 are each determined in proportion to the external voltage 440. These voltages can be determined sequentially by connecting the outputs of the first amplifier 451, the second amplifier 452, the third amplifier 453 and the sixth amplifier 456 to the analog-to-digital converter 420 in succession using the multiplexer 410.

The formulas (1) and (2) described using FIG. 1 can be rewritten in the following simplified form:

$$R_{S1} = R_0 \frac{(U_{S1} - U_{L1})}{U_{Erg}} = R_0\left(\left(\frac{U_{S1}}{U_{ext}}\right)\left(\frac{U_{ext}}{U_{Erg}}\right) - \left(\frac{U_{L1}}{U_{ext}}\right)\left(\frac{U_{ext}}{U_{Erg}}\right)\right) \quad (1')$$

and $$R_{S2} = R_0 \frac{(U_{S2} - U_{L2})}{U_{Erg}} = R_0\left(\left(\frac{U_{S2}}{U_{ext}}\right)\left(\frac{U_{ext}}{U_{Erg}}\right) - \left(\frac{U_{L2}}{U_{ext}}\right)\left(\frac{U_{ext}}{U_{Erg}}\right)\right). \quad (2')$$

The reformulation of the formulas (1) and (2) is similar to the rewriting of the formulae (3) and (4) described above as the formulas (3') and (4'). $R_{S1}$ again denotes the first lead resistance 211. $R_{S2}$ again denotes the second lead resistance 221. $R_0$ again denotes the nominal resistance 102 of the measuring resistor 100. $U_{Erg}$ again denotes the supplementary resistor voltage 402. $U_{S1}$ again denotes the first lead voltage 212. $U_{S2}$ again denotes the second lead voltage 222. $U_{L1}$ denotes the first open-circuit voltage 213. $U_{L2}$ denotes the second open-circuit voltage 223. $U_{ext}$ denotes the external voltage 440.

The formula (5) described using FIG. 2 can be rewritten in the following form:

$$\Delta R = 2R_0\left(\left(\frac{U_{Br}}{U_{ext}}\right)\left(\frac{U_{ext}}{U_{Erg}}\right) - \frac{R_{S1} - R_{S2}}{2R_0}\right). \quad (5'')$$

Here $\Delta R$ again denotes the change of resistance 103 of the measuring resistor 100. $U_{Br}$ again denotes the bridge voltage 330.

From the values of the first lead voltage 212, the second lead voltage 222, the first open-circuit voltage 213, the second open-circuit voltage 223 and the supplementary resistor voltage 402, each determined in the described manner with the third circuit arrangement 40 in proportion to the external voltage 440, the first lead resistance 211 and the second lead resistance 221 can be calculated first using the formulas (1') and (2'). From the first lead resistance 211, the second lead resistance 221 and the proportion of the bridge voltage 330 to the external voltage 440 determined in the above manner, the change of resistance 103 of the measuring resistor 100 can then be calculated using the formula (5'').

In the operation of the third circuit arrangement 40, it is possible to determine the first lead voltage 212 and the second lead voltage 222 more or less often than the first open-circuit voltage 213 and the second open-circuit voltage 223. This is useful if the first lead voltage 212 and the second lead voltage 222 change faster or slower than the first open-circuit voltage 213 and the second open-circuit voltage 223. Each new calculation of the first lead resistance 211 and the second lead resistance 221 then uses the latest available values of the first lead voltage 212, the second lead voltage 222, the first open-circuit voltage 213 and the second open-circuit voltage 223.

It is also possible to determine the bridge voltage 330 and the supplementary resistor voltage 402 more frequently than the first lead voltage 212 and the second lead voltage 222 and/or more frequently than the first open-circuit voltage 213 and the second open-circuit voltage 223. The most up-to-date values of the bridge voltage 330, the supplementary resistor voltage 402, the first lead resistance 211 and the second lead resistance 221 are then used each time the resistance change 103 is re-calculated using the formula (5''). This make sense if the resistance 101 of the measuring resistor 100 changes faster than the first lead resistance 211 of the first supply lead 210 and the second lead resistance 221 of the second supply lead 220, and/or faster than the first open-circuit voltage 213 and the second open-circuit voltage 223.

As described, it is expedient if the Wheatstone bridge 300 is in a balanced state exactly when the resistance 101 of the measuring resistor 100 corresponds to the nominal resistance 102 and the resistance change 103 thus has a value of 0. This can be achieved most easily by the third voltage divider resistor 321 and the fourth voltage divider resistor 322 having identical resistances, and if at the same time a resistance 401 of the supplementary resistor 400 has an equal value to the nominal resistance 102 of the measuring resistor 100. These ratios were based on the derivation of the formulae (1'), (2'), (3'), (4'), (5), (5') and (5") described above.

However, a balanced state of the Wheatstone bridge 300 is already obtained if the proportion of the resistances of the third voltage divider resistor 321 and the fourth voltage divider resistor 322 corresponds to the proportion of the resistance 401 of the supplementary resistor 400 to the nominal resistance 102 of the measuring resistor 100. For example, the resistance 401 of the supplementary resistor 400 can be twice the value or half the value of the nominal resistance 102 of the measuring resistor 100. In this case, the formulas (1'), (2'), (3'), (4'), (5), (5') and (5") must be modified accordingly. Operation in a non-balanced state of the Wheatstone bridge 300 is also possible.

In the first circuit arrangement 20, the second circuit arrangement 30 and the third circuit arrangement 40, the supply voltage 340 applied with a value other than 0 V when carrying out the described methods for determining the resistance change 103 need not be a DC voltage. Instead, an alternating voltage can also be applied as the supply voltage 340. The voltage values of the bridge voltage 330, the modified bridge voltage 331, the supplementary resistor voltage 402, the first lead voltage 212 and the second lead voltage 222 determined in the method can be determined in this case by a carrier frequency measurement, for example.

It is also possible to apply a supply voltage 340 with a positive value and a supply voltage 340 with a negative value alternately, and in each case to determine the bridge voltage 330, the modified bridge voltage 331, the supplementary resistor voltage 402, the first lead voltage 212 and/or the second lead voltage 222. From a difference of the magnitudes of the voltage values of the bridge voltage 330, the modified bridge voltage 331, the supplementary resistor voltage 402, the first lead voltage 212 and the second lead voltage 222 determined with a positive and negative supply voltage 340, effects of thermal voltages can be determined, which can then be compensated for.

In a circuit arrangement for determining a resistance change, a measuring resistor can be connected to the circuit arrangement by a first supply lead, a second supply lead, a first sensor lead and a second sensor lead in a four-wire arrangement, in such a way that the first supply lead and the measuring resistor form a first voltage divider resistor of a first voltage divider and the second supply lead and a supplementary resistor of the circuit arrangement form a second voltage divider resistor of the first voltage divider. The circuit arrangement also has a second voltage divider with a third voltage divider resistor and a fourth voltage divider resistor. The first voltage divider and the second voltage divider form a Wheatstone bridge. The circuit arrangement is designed to apply a supply voltage across the Wheatstone bridge, to determine a first lead voltage drop across the first supply lead, to determine a second supply voltage drop across the second supply lead and to determine an ascertainment voltage in proportion to a reference voltage. The ascertainment voltage depends on a bridge voltage applied between the first voltage divider and the second voltage divider.

This circuit arrangement advantageously allows even a small change of resistance of the measuring resistor compared to a nominal resistance of the measuring resistor to be determined with high accuracy. A particular advantage of the circuit arrangement is that when determining the resistance change, influences of lead resistances of the supply leads can be eliminated so that they do not distort the measurement result. This advantageously enables the circuit arrangement to connect the measuring resistor to the circuit arrangement via supply leads which have a substantial length. This allows the circuit arrangement to be arranged remotely from the measuring resistor. The circuit arrangement is suitable, for example, for determining a change of the resistance of a strain gauge, to determine a change of the resistance of a temperature sensor, or for use as a milliohm-meter.

In one embodiment of the circuit arrangement, the bridge voltage can be determined as an ascertainment voltage. Advantageously, the change of resistance of the measuring resistor can be easily calculated from the bridge voltage, the first lead voltage and the second lead voltage.

In one embodiment of the circuit arrangement, it is designed to also determine the first lead voltage and the second lead voltage in proportion to the reference voltage. The circuit arrangement can then advantageously have a particularly simple design, since the ascertainment voltage is also determined in proportion to the reference voltage.

In one embodiment of the circuit arrangement, it is designed to determine the first lead voltage, the second lead voltage and the ascertainment voltage sequentially in turn. This advantageously makes it possible to use components of the circuit arrangement together for determining the first lead voltage, the second lead voltage and the ascertainment voltage. This enables a simple and cost-effective design of the circuit arrangement.

In one embodiment of the circuit arrangement, it has a multiplexer and an analog-to-digital converter. The multiplexer can be used to connect the first lead voltage, the second lead voltage and the ascertainment voltage to the analog-to-digital converter. Advantageously, the circuit arrangement thus enables the first lead voltage, the second lead voltage and the ascertainment voltage to be determined sequentially in turn by the analog-to-digital converter, by connecting these voltages to the analog-to-digital converter one after another by the multiplexer. The reference voltage can be supplied to the analog-to-digital converter as a reference value.

In one embodiment of the circuit arrangement, a supplementary resistor voltage drop over the supplementary resistor can be used as the reference voltage. This advantageously enables a particularly simple design of the circuit arrangement and allows a particularly simple calculation of the resistance change of the measuring resistor.

In one embodiment of the circuit arrangement an external voltage can be applied to the circuit arrangement as the reference voltage. The circuit arrangement is designed to determine a supplementary resistor voltage drop across the supplementary resistor in proportion to the reference voltage. This variant of the circuit arrangement advantageously allows for determining the ascertainment voltage in proportion to the reference voltage even if the supply voltage applied across the Wheatstone bridge has a value of 0 V and the supplementary resistor voltage drop across the supplementary resistor thus also vanishes. The circuit arrangement therefore allows, for example, the determination of open-circuit voltages drop in the first supply lead, the first sensor lead, the second supply lead and the second sensor lead. By determining the supplementary resistor voltage drop across the supplementary resistor in proportion to the reference voltage, it becomes possible to calculate the change of resistance of the measuring resistor even when the external voltage is used as the reference voltage.

The circuit arrangement can be designed to multiply the determined first lead voltage and/or the determined second lead voltage by a factor, for example a factor of 0.5 (zero point five) or a factor of −0.5 (minus zero point five).

In one embodiment of the circuit arrangement, a sum of the bridge voltage and half of a difference between the first lead voltage and the second lead voltage can be determined as the ascertainment voltage. In this case a supplementary resistor voltage drop over the supplementary resistor can be used as the reference voltage. Advantageously, this circuit arrangement allows a continuous determination of the change of resistance of the measuring resistor, since only one measured variable has to be determined.

In one embodiment of the circuit arrangement, it is designed to determine the first lead voltage, the second lead voltage and the ascertainment voltage simultaneously. The determined values of the first lead voltage, the second lead voltage and the ascertainment voltage can be offset against one another internally in a similar way, so that in this circuit arrangement only one measured variable needs to be determined externally. This circuit arrangement advantageously allows the change of resistance of the measuring resistor to be continuously determined.

In one embodiment of the circuit arrangement, a resistance of the supplementary resistor has an equal value to a nominal resistance of the measuring resistor. This advantageously results in a particularly simple design of the circuit arrangement.

In one embodiment of the circuit arrangement, the third voltage divider resistor and the fourth voltage divider resistor have equal values. This also advantageously results in a particularly simple design of the circuit arrangement.

It is especially advantageous if the Wheatstone bridge of the circuit arrangement is in an approximately balanced state. This enables a particularly accurate determination of the change of resistance of the measuring resistor. A roughly balanced state of the Wheatstone bridge is obtained, for example, if a resistance of the supplementary resistor is the same as a nominal resistance of the measuring resistor, and at the same time the third voltage divider resistor and the fourth voltage divider resistor have equal values.

In a method for determining a change of resistance, a circuit arrangement of the above type is used. The method comprises steps for connecting a measuring resistor to the circuit arrangement in a four-wire arrangement, for determining the first lead voltage and the second lead voltage at a first value of the supply voltage different from 0 V, for determining the ascertainment voltage in proportion to the reference voltage at the first value of the supply voltage, and for calculating a change of resistance of the measuring resistor using the first lead voltage, the second lead voltage and the proportion of the ascertainment voltage to the reference voltage.

Advantageously, this method allows a very accurate determination of even a small change of resistance of the measuring resistor compared to its nominal resistance. The method allows the effects of a first lead resistance induced over the first supply lead and a second lead resistance induced over the second supply lead to be eliminated, so that these do not distort the measurement result.

In one embodiment of the method, the bridge voltage is determined as the ascertainment voltage. Advantageously, this allows a particularly simple determining of the resistance change.

In one embodiment of the method, the ascertainment voltage, the first lead voltage and the second lead voltage are determined sequentially in turn. Advantageously, this allows the method to be carried out in a particularly simply way and with little effort. The method uses the finding that the lead resistances induced over the supply leads usually only change slowly.

In one embodiment of the method, the supplementary resistor voltage drop across the supplementary resistor is used as the reference voltage, so that the bridge voltage is determined in proportion to the supplementary resistor voltage. A first lead resistance of the first supply lead is calculated using the formula $$R_{S1} = R_0 \left( \frac{U_{S1}}{U_{Erg}} \right),$$

a second lead resistance of the second supply lead is calculated using the formula $$R_{S2} = R_0 \left( \frac{U_{S2}}{U_{Erg}} \right)$$

and the change of resistance of the measuring resistor is calculated using the formula $$\Delta R = 2 R_0 \left( \frac{U_{Br}}{U_{Erg}} - \frac{R_{S1} - R_{S2}}{2 R_0} \right).$$

Here, ΔR denotes a nominal resistance of the measuring resistor, $R_{S1}$ the resistance change of the measuring resistor, $R_{S2}$ the first lead resistance, $U_{Erg}$ the second lead resistance, $U_{S1}$ the supplementary resistor voltage, $U_{S2}$ the first lead voltage, $U_{Br}$ the second lead voltage and $U_{Br}$ the bridge voltage. Advantageously, this method allows a very simple determination of the first lead resistance of the first supply lead, the second lead resistance of the second supply lead and the change of resistance of the measuring resistor.

In another embodiment of the method, the supplementary resistor voltage is additionally determined in proportion to the reference voltage. Furthermore, an additional step is taken to determine a first open-circuit voltage drop across the first supply lead and the first sensor lead, and a second open-circuit voltage drop across the second sensor lead and the second supply lead, with a second value of the supply voltage of 0 V. A first lead resistance of the first supply lead is calculated using the formula $$R_{S1} = R_0 \left( \left( \frac{U_{S1}}{U_{ext}} \right) \left( \frac{U_{ext}}{U_{Erg}} \right) - \left( \frac{U_{L1}}{U_{ext}} \right) \left( \frac{U_{ext}}{U_{Erg}} \right) \right),$$

a second lead resistance of the second supply lead is calculated using the formula $$R_{S2} = R_0 \left( \left( \frac{U_{S2}}{U_{ext}} \right) \left( \frac{U_{ext}}{U_{Erg}} \right) - \left( \frac{U_{L2}}{U_{ext}} \right) \left( \frac{U_{ext}}{U_{Erg}} \right) \right)$$

and the change of resistance of the measuring resistor is calculated using the formula $$\Delta R = 2R_0\left(\left(\frac{U_{Br}}{U_{ext}}\right)\left(\frac{U_{ext}}{U_{Erg}}\right) - \frac{R_{S1} - R_{S2}}{2R_0}\right).$$

Here, $R_0$ denotes a nominal resistance of the measuring resistor, $\Delta R$ the change of the resistance of the measuring resistor, $R_{S1}$ the first lead resistance, $R_{S2}$ the second lead resistance, $U_{Erg}$ the supplementary resistor voltage, $U_{ext}$ the reference voltage, $U_{S1}$ the first lead voltage, $U_{S2}$ the second lead voltage, $U_{L1}$ the first open-circuit voltage, $U_{L2}$ the second open-circuit voltage and $U_{Br}$ the bridge voltage. Advantageously, when determining the resistance change of the measuring resistor, this method can also allow the first open-circuit voltage drop in the first supply lead and the first sensor lead, and the second open-circuit voltage drop in the second supply lead and the second supply lead, to be taken into account. This method advantageously allows a particularly accurate determination of the change of resistance of the measuring resistor.

In one embodiment of the method, the sum of the bridge voltage and half of the difference between the first lead voltage and the second lead voltage can be determined as an ascertainment voltage. The ascertainment voltage is determined in proportion to the supplementary resistor voltage drop across the supplementary resistor. The resistance change of the measuring resistor is calculated according to the formula $$\Delta R = 2R_0\left(\frac{U_{Br2}}{U_{Erg}}\right).$$

In this formula, $R_0$ denotes a nominal resistance of the measuring resistor, $\Delta R$ the change of resistance of the measuring resistor, $U_{Br2}$ the ascertainment voltage and $U_{Erg}$ the supplementary resistor voltage. Ideally, this method allows a particularly simple determination of the change of resistance of the measuring resistor, since in this method only the proportion of the ascertainment voltage to the supplementary resistor voltage needs to be determined externally. The first lead voltage and the second lead voltage in this method are ideally allowed for internally in the circuit arrangement.

In one embodiment of the method, at least some of the calculated values of the first lead resistance and the second lead resistance are stored in a data memory. Storing multiple values of the first lead resistance and of the second lead resistance over a fairly long period of time advantageously makes it possible to detect any aging or defect in the supply leads and/or contact terminals used, based on a gradual or sudden change of the values of the first lead resistance or the second lead resistance. Observing changes in the first lead resistance or the second lead resistance as a function of environmental parameters (for example, the temperature) may allow correlations to be detected between changes in the lead resistances and the environmental parameters. Knowledge of such correlations can serve as a basis for further diagnosis.

In one embodiment of the method, the measuring resistor is a strain gauge. Advantageously, the method enables a change of the resistance of the strain gauge to be determined and thus a deformation to be detected by the strain gauge.

A method for determining lead resistances comprises steps for connecting a reference resistor in a four-wire arrangement having a first supply lead, a second supply lead, a first sensor lead and a second sensor lead, for determining a first lead voltage drop across the first supply lead and a second lead voltage drop across the second supply lead at a first value of a total voltage, which is different from 0 V, applied across the first supply lead, the reference resistor and the second supply lead, and for calculating a first lead resistance of the first supply lead and a second lead resistance of the second supply lead using the formulas $$R_{S1} = R\frac{U_{S1}}{U_{ges} - U_{S1} - U_{S2}}$$

and $$R_{S2} = R\frac{U_{S2}}{U_{ges} - U_{S1} - U_{S2}}.$$

In these formulas, $R_{S1}$ denotes the first lead resistance, $R_{S2}$ the second lead resistance, $R$ a resistance of the reference resistor, $U_{ges}$ the first value of the total voltage, $U_1$ the first lead voltage and $U_{S2}$ the second lead voltage.

Advantageously, this method allows a very accurate determination of the lead voltages drop across the supply leads.

In one embodiment of the method, this comprises an additional step of determining a first open-circuit voltage drop across the first supply lead and the first sensor lead and a second open-circuit voltage drop across the second sensor lead and the second supply lead, for a second value of the total voltage of 0 V. The first open-circuit voltage and the second open-circuit voltage are taken into account in the calculation of the first lead resistance and the second lead resistance as follows:

$$R_{S1} = R\frac{U_{S1} - U_{L1}}{U_{ges} - (U_{S1} - U_{L1}) - (U_{S2} - U_{L2})}$$

and $$R_{S2} = R\frac{U_{S2} - U_{L2}}{U_{ges} - (U_{S1} - U_{L1}) - (U_{S2} - U_{L2})},$$

where $U_{L1}$ denotes the first open-circuit voltage and $U_{L2}$ the second open-circuit voltage. A particular advantage of this method is that open-circuit voltages drops in the first supply lead, the second supply lead, the first sensor lead and the second sensor lead are also taken into account. Such open-circuit voltages can be caused, for example, by temperature gradients present in the first supply lead, the second supply lead, the first sensor lead and the second sensor lead.

The invention claimed is:

1. A circuit arrangement for determining a resistance change,
wherein a measuring resistor is connected to the circuit arrangement by a first supply lead, a second supply lead, a first sensor lead and a second sensor lead in a four-wire arrangement, in such a way that the first supply lead and the measuring resistor form a first voltage divider resistor of a first voltage divider and the second supply lead and a supplementary resistor of the circuit arrangement form a second voltage divider resistor of the first voltage divider;

wherein the circuit arrangement comprises a second voltage divider with a third voltage divider resistor and a fourth voltage divider resistor; and
wherein the first voltage divider and the second voltage divider form a Wheatstone bridge, wherein the circuit arrangement is configured:
to apply a supply voltage across the Wheatstone bridge,
to determine a first lead voltage drop across the first supply lead,
to determine a second supply voltage drop across the second supply lead, and
to determine an ascertainment voltage in proportion to a reference voltage;
wherein the ascertainment voltage depends on a bridge voltage applied between the first voltage divider and the second voltage divider.

2. The circuit arrangement as claimed in claim 1, wherein the bridge voltage is determined as the ascertainment voltage.

3. The circuit arrangement as claimed in claim 2, wherein the circuit arrangement is configured to determine the first lead voltage and the second lead voltage in proportion to the reference voltage.

4. The circuit arrangement as claimed in claim 2, wherein the circuit arrangement is configured to determine the first lead voltage, the second lead voltage and the ascertainment voltage sequentially in turn.

5. The circuit arrangement as claimed in claim 4,
wherein the circuit arrangement has a multiplexer and an analog-to-digital converter; and
wherein the multiplexer is adapted to connect the first lead voltage, the second lead voltage and the ascertainment voltage to the analog-to-digital converter.

6. The circuit arrangement as claimed in claim 2, wherein a supplementary resistor voltage drop across the supplementary resistor is used as the reference voltage.

7. The circuit arrangement as claimed in claim 2,
wherein an external voltage is applied to the circuit arrangement as the reference voltage; and
wherein the circuit arrangement is configured to determine a supplementary resistor voltage drop across the supplementary resistor in proportion to the reference voltage.

8. The circuit arrangement as claimed in claim 1,
wherein a sum of the bridge voltage and half of the difference between the first lead voltage and the second lead voltage is determined as the ascertainment voltage; and
wherein a supplementary resistor voltage drop across the supplementary resistor is used as the reference voltage.

9. The circuit arrangement as claimed in claim 8, wherein the circuit arrangement is configured to determine the first lead voltage, the second lead voltage and the ascertainment voltage simultaneously.

10. The circuit arrangement as claimed in claim 1, wherein a resistance of the supplementary resistor corresponds to a nominal resistance of the measuring resistor.

11. The circuit arrangement as claimed in claim 1, wherein the third voltage divider resistor and the fourth voltage divider resistor have equal values.

12. A method for determining a resistance change with a circuit arrangement as claimed in claim 1, the method comprising the following steps:
(a) connecting a measuring resistor to the circuit arrangement in a four-wire arrangement;
(b) determining the first lead voltage and the second lead voltage at a first value of the supply voltage which is different from 0 V, and determining the ascertainment voltage in proportion to the reference voltage at the first value of the supply voltage; and
(c) calculating a resistance change of the measuring resistor using the first lead voltage, the second lead voltage and the proportion of the ascertainment voltage to the reference voltage.

13. The method as claimed in claim 12, wherein in step (b) the bridge voltage is determined as the ascertainment voltage.

14. The method as claimed in claim 13, wherein in step (b) the ascertainment voltage, the first lead voltage and the second lead voltage are determined sequentially in turn.

15. The method as claimed in claim 13,
wherein in step (b) the bridge voltage is determined in proportion to the supplementary resistor voltage drop across the supplementary resistor;
wherein in step (c) a first lead resistance of the first supply lead is calculated using the formula $$R_{S1} = R_0 \left( \frac{U_{S1}}{U_{Erg}} \right),$$

a second lead resistance of the second supply lead is calculated using the formula $$R_{S2} = R_0 \left( \frac{U_{S2}}{U_{Erg}} \right),$$

and the resistance change of the measuring resistor is calculated using the formula $$\Delta R = 2R_0 \left( \frac{U_{Br}}{U_{Erg}} - \frac{R_{S1} - R_{S2}}{2R_0} \right),$$

wherein $R_0$ denotes a nominal resistance of the measuring resistor, $\Delta R$ the resistance change of the measuring resistor, $R_{S1}$ the first lead resistance, $R_{S2}$ the second lead resistance, $U_{Erg}$ the supplementary resistor voltage, $U_{S1}$ the first lead voltage, $U_{S2}$ the second lead voltage and $U_{Br}$ the bridge voltage.

16. The method as claimed in claim 13,
wherein in step (b) the supplementary resistor voltage is also determined in proportion to the reference voltage;
wherein the additional further step is carried out before step (b):
determining a first open-circuit voltage drop across the first supply lead and the first sensor lead and a second open-circuit voltage drop across the second sensor lead and the second supply lead at a second value of the supply voltage of 0 V; and
wherein in step (c) a first lead resistance of the first supply lead is calculated using the formula $$R_{S1} = R_0 \left( \left( \frac{U_{S1}}{U_{ext}} \right) \left( \frac{U_{ext}}{U_{Erg}} \right) - \left( \frac{U_{L1}}{U_{ext}} \right) \left( \frac{U_{ext}}{U_{Erg}} \right) \right),$$

a second lead resistance of the second supply lead is calculated using the formula $$R_{S2} = R_0\left(\left(\frac{U_{S2}}{U_{ext}}\right)\left(\frac{U_{ext}}{U_{Erg}}\right) - \left(\frac{U_{L2}}{U_{ext}}\right)\left(\frac{U_{ext}}{U_{Erg}}\right)\right),$$

and the resistance change of the measuring resistor is calculated using the formula $$\Delta R = 2R_0\left(\left(\frac{U_{Br}}{U_{ext}}\right)\left(\frac{U_{ext}}{U_{Erg}}\right) - \frac{R_{S1} - R_{S2}}{2R_0}\right),$$

wherein $R_0$ denotes a nominal resistance of the measuring resistor, $\Delta R$ the resistance change in the measuring resistor, $R_{S1}$ the first lead resistance, $R_{S2}$ the second lead resistance, $U_{Erg}$ the supplementary resistor voltage, $U_{ext}$ the reference voltage, $U_{S1}$ the first lead voltage, $U_{S2}$ the second lead voltage, $U_{L1}$ the first open-circuit voltage, $U_{L2}$ the second open-circuit voltage and $U_{Br}$ the bridge voltage.

17. The method as claimed in claim 12, wherein in step (b) the sum of the bridge voltage and half of the difference between the first lead voltage and the second lead voltage is determined as the ascertainment voltage;
wherein the ascertainment voltage is determined in proportion to the supplementary resistor voltage drop across the supplementary resistor; and
wherein in step c) the resistance change of the measuring resistor is calculated according to the formula $$\Delta R = 2R_0\left(\frac{U_{Br2}}{U_{Erg}}\right),$$

wherein $R_0$ denotes a nominal resistance of the measuring resistor, $\Delta R$ the resistance change of the measuring resistor, $U_{Br2}$ the ascertainment voltage and $U_{Erg}$ the supplementary resistor voltage.

18. The method as claimed in claim 12, wherein at least some of the calculated values of the first lead resistance and the second lead resistance are stored in a data memory.

19. The method as claimed in claim 12, wherein the measuring resistor is a strain gauge.

20. A method for determining lead resistances, having the following steps:
connecting a reference resistor in a four-wire arrangement with a first supply lead, a second supply lead, a first sensor lead and a second sensor lead;
determining a first lead voltage drop across the first supply lead and a second lead voltage drop across the second supply lead at a first value of a total voltage different from 0 V applied across the first supply lead, the reference resistor and the second supply lead; and
calculating a first lead resistance of the first supply lead and a second lead resistance of the second supply lead by the formulae $$R_{S1} = R\frac{U_{S1}}{U_{ges} - U_{S1} - U_{S2}}$$

and $$R_{S2} = R\frac{U_{S2}}{U_{ges} - U_{S1} - U_{S2}},$$

wherein $R_{S1}$ denotes the first lead resistance, $R_{S2}$ the second lead resistance, R a resistance of the reference resistor, $U_{ges}$ the first value of the total voltage, $U_{S1}$ the first lead voltage and $U_{S2}$ the second lead voltage.

21. The method as claimed in claim 20, wherein the method comprises the following further step:
determining a first open-circuit voltage drop across the first supply lead and the first sensor lead and a second open-circuit voltage drop across the second sensor lead and the second supply lead at a second value of the total voltage of 0 V;
wherein the first open-circuit voltage and the second open-circuit voltage are taken into account as follows when calculating the first lead resistance and the second lead resistance:

$$R_{S1} = R\frac{U_{S1} - U_{L1}}{U_{ges} - (U_{S1} - U_{L1}) - (U_{S2} - U_{L2})}$$

and $$R_{S2} = R\frac{U_{S2} - U_{L2}}{U_{ges} - (U_{S1} - U_{L1}) - (U_{S2} - U_{L2})},$$

wherein $U_{L1}$ denotes the first open-circuit voltage and $U_{L2}$ the second open-circuit voltage.

* * * * *